United States Patent
Liu et al.

(10) Patent No.: US 12,431,902 B2
(45) Date of Patent: Sep. 30, 2025

(54) SYSTEMS AND METHODS FOR LOW POWER MODES FOR PROGRAMMABLE LOGIC DEVICES

(71) Applicant: Intel Corporation, Santa Clara, CA (US)

(72) Inventors: Ping-Chen Liu, Portland, OR (US); Andy Lee, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 769 days.

(21) Appl. No.: 17/561,157

(22) Filed: Dec. 23, 2021

(65) Prior Publication Data

US 2022/0123753 A1  Apr. 21, 2022

(51) Int. Cl.
*H03K 19/173* (2006.01)
*H03K 19/094* (2006.01)
*H03K 19/177* (2020.01)

(52) U.S. Cl.
CPC ....... *H03K 19/1737* (2013.01); *H03K 19/094* (2013.01); *H03K 19/177* (2013.01)

(58) Field of Classification Search
CPC ....... H03K 19/17728; H03K 19/17704; H03K 19/1733; H03K 19/17736; H03K 19/1737; H03K 19/1776; H03K 19/17744; G06F 17/5054
See application file for complete search history.

(56) References Cited

U.S. PATENT DOCUMENTS

| | | | | |
|---|---|---|---|---|
| 7,107,566 B1* | 9/2006 | McElheny | ............... | G06F 30/34 716/133 |
| 7,477,073 B1* | 1/2009 | Tuan | ................ | H03K 19/17736 326/63 |
| 7,705,659 B1* | 4/2010 | Liu | ......................... | G11C 5/147 327/143 |
| 10,079,054 B1* | 9/2018 | Gunaratna | ........... | H03K 19/177 |
| 2017/0201256 A1* | 7/2017 | Ng | ..................... | H03K 19/1776 |
| 2018/0096714 A1* | 4/2018 | Ng | .................... | H03K 19/17736 |
| 2019/0379380 A1* | 12/2019 | Atsatt | ..................... | G11C 15/00 |
| 2020/0105317 A1* | 4/2020 | Venkatram | .......... | G06F 13/1694 |

\* cited by examiner

*Primary Examiner* — Seokjin Kim

(74) *Attorney, Agent, or Firm* — Fletcher Yoder, P.C.

(57) ABSTRACT

Systems and methods of the present disclosure may provide efficient power consumption for programmable logic devices based on unused portions of programmable logic. A programmable logic device includes a plurality of programmable logic sectors that implement a circuit design, unused portions of the programmable logic device, and interconnection resources. The interconnection resources include a multiplexer that receives a control signal and that generates an output signal based on the control signal and a driver that receives the output signal and that implements a low-power mode to reduce leakage current.

20 Claims, 15 Drawing Sheets

SYSTEMS AND METHODS FOR LOW POWER MODES FOR PROGRAMMABLE LOGIC DEVICES

BACKGROUND

The present disclosure relates generally to integrated circuit (IC) devices such as programmable logic devices (PLDs). More particularly, the present disclosure relates to lower power modes for field programmable gate arrays (FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be found in a wide variety of products, including computers, handheld devices, industrial infrastructure, televisions, and vehicles. Many of these integrated circuit devices are application-specific integrated circuits (ASICs) that are designed and manufactured to perform specific tasks. A programmable logic device such as an FPGA, by contrast, may be configured after manufacturing with a variety of different system designs. As such, programmable logic devices may be used for varying tasks and/or workloads. However, static power feeds for the programmable logic devices may result in inefficient power consumption.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
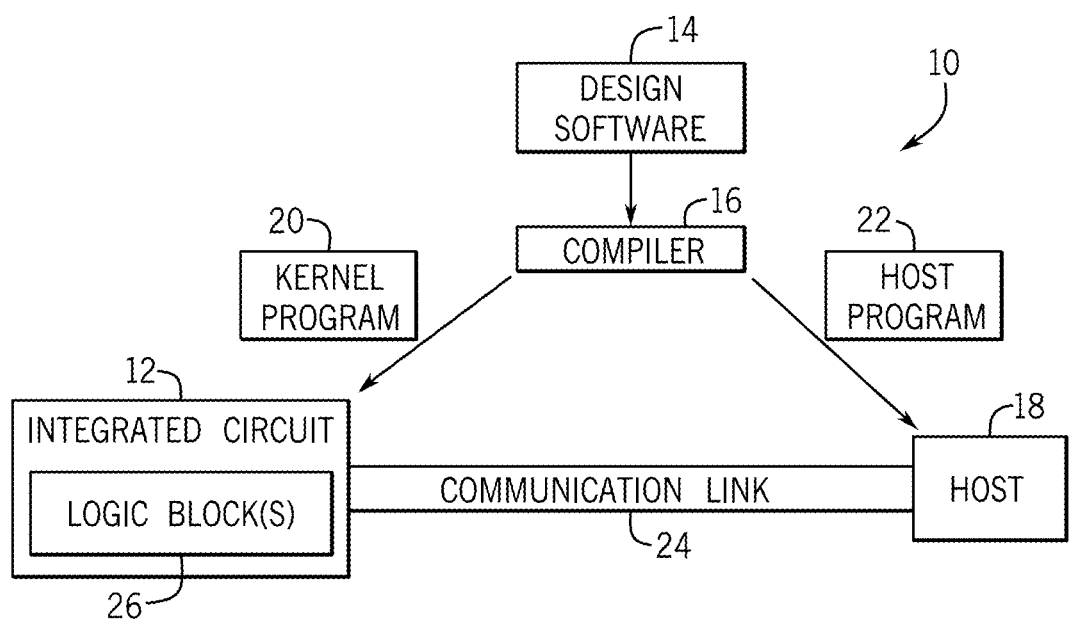
FIG. 1 is a block diagram of a system used to program an integrated circuit, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Programmable logic devices are increasingly permeating markets and are increasingly enabling customers to implement circuit designs in logic fabric (e.g., programmable logic). Due to the highly customizable nature of programmable logic devices, the logic fabric is to be configured with a circuit design prior to use of the circuit corresponding to the circuit design. When implementing designs in the logic fabric, sectors may be used to allocate portions of the logic fabric to implement the circuit. Because sectors may be employed for different operations, sectors of the programmable logic device may be programmed to use different circuit components (e.g., logic gates) to perform respective operations.

Programmable logic fabric of an integrated circuit may be programmed to implement a programmable circuit design to perform a wide range of functions and operations. The programmable logic fabric may also include configurable blocks of programmable logic (e.g., sometimes referred to as logic array blocks (LABs) or configurable logic blocks (CLBs)) that have lookup tables (LUTs) that can be configured to operate as different logic elements based on the configuration data programmed into memory cells in the blocks.

Integrated circuit devices may employ power gating to enable or disable components of an integrated circuit by shutting off the current to portions of the integrated circuit. Power gating techniques may utilize additional power gating circuitry to generate gating signals. Moreover, timing delays may result from the signals passing through the power gating circuitry. Fine-level power gating (e.g., each component includes a corresponding power gating circuit) techniques may utilize significant portions of the integrated circuit device for the power gating circuitries. By employing coarse-level power gating (e.g., a single gating signal for multiple components) techniques, the area taken up by the power gating circuitry may be reduced as a single instance of a power gating circuit may disable multiple components. However, coarse-level power gating techniques may be inefficient in disabling components when multiple components corresponding to the power gating circuitry are not in use since the power gating is not applied or operations may be negatively impacted.

With the foregoing in mind, FIG. 1 illustrates a block diagram of a system 10 that may implement arithmetic operations. A designer may desire to implement functionality, such as the operations of this disclosure, on an integrated circuit 12 (e.g., a programmable logic device, such as a field programmable gate array (FPGA) or an application specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software 14, such as a version of INTEL® QUARTUS® by INTEL CORPORATION. The design software 14 may use a compiler 16 to convert the high-level program into a lower-level description. The compiler 16 may provide machine-readable instructions representative of the high-level program to a host 18 and the integrated circuit 12. The host 18 may receive a host program 22 which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit 12. The logic block 26 may include circuitry and/or other logic elements and may be configured to implement arithmetic operations, such as addition and multiplication.

In some embodiments, the designer may use the design software 14 to determine a speed of the integrated circuit 12 and/or a sector of the integrated circuit 12, determine a criticality of a path of a design programmed in the integrated circuit and/or a sector of the integrated circuit 12, and the like. The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
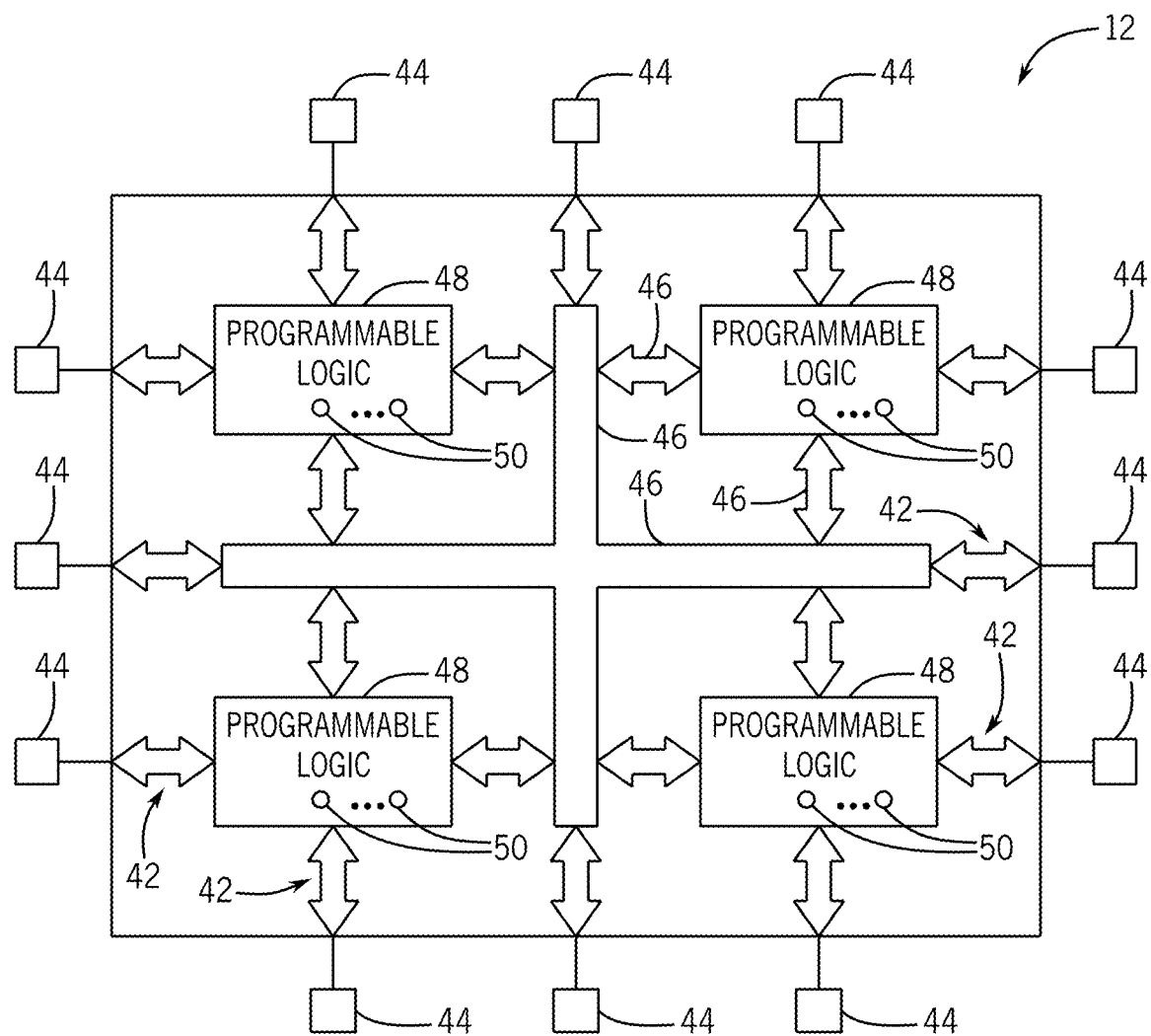
FIG. 2 is a block diagram of the integrated circuit of FIG. 1, in accordance with an embodiment of the present disclosure.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). The integrated circuit 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements 50 with the programmable logic 48. For example, as discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the discussion of FIG. 1 and FIG. 2 in mind, a user (e.g., a designer) may utilize the design software 14 to implement the logic block 26 on the programmable logic 48 of the integrated circuit 12. In particular, the designer may specify in a high-level program that mathematical operations such as addition and multiplication be performed. The compiler 16 may convert the high-level program into a lower-level description that is used to program the programmable logic 48 to perform the operations.

Figure 3:
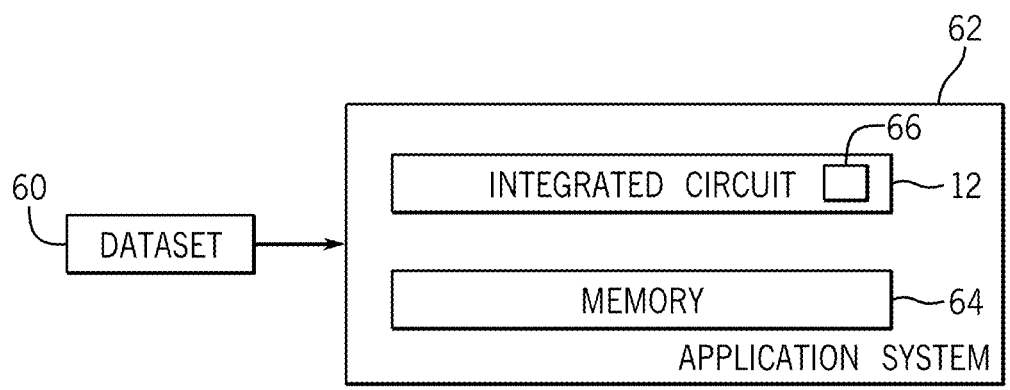
FIG. 3 is a block diagram of an application system that includes the integrate circuit of FIG. 1 and a memory, in accordance with an embodiment.

Once programmed, the integrated circuit 12 may process a dataset 60, as is shown in FIG. 3. FIG. 3 is a block diagram of an application system 62 that includes the integrated circuit 12 and memory 64. The application system 62 may represent a device that uses the integrated circuit 12 to perform operations based on computational results from the integrated circuit 12, or the like. The integrated circuit 12 may directly receive the dataset 60. The dataset 60 may be stored into the memory 64 before, during, or concurrent to transmission to the integrated circuit 12.

Figure 4:
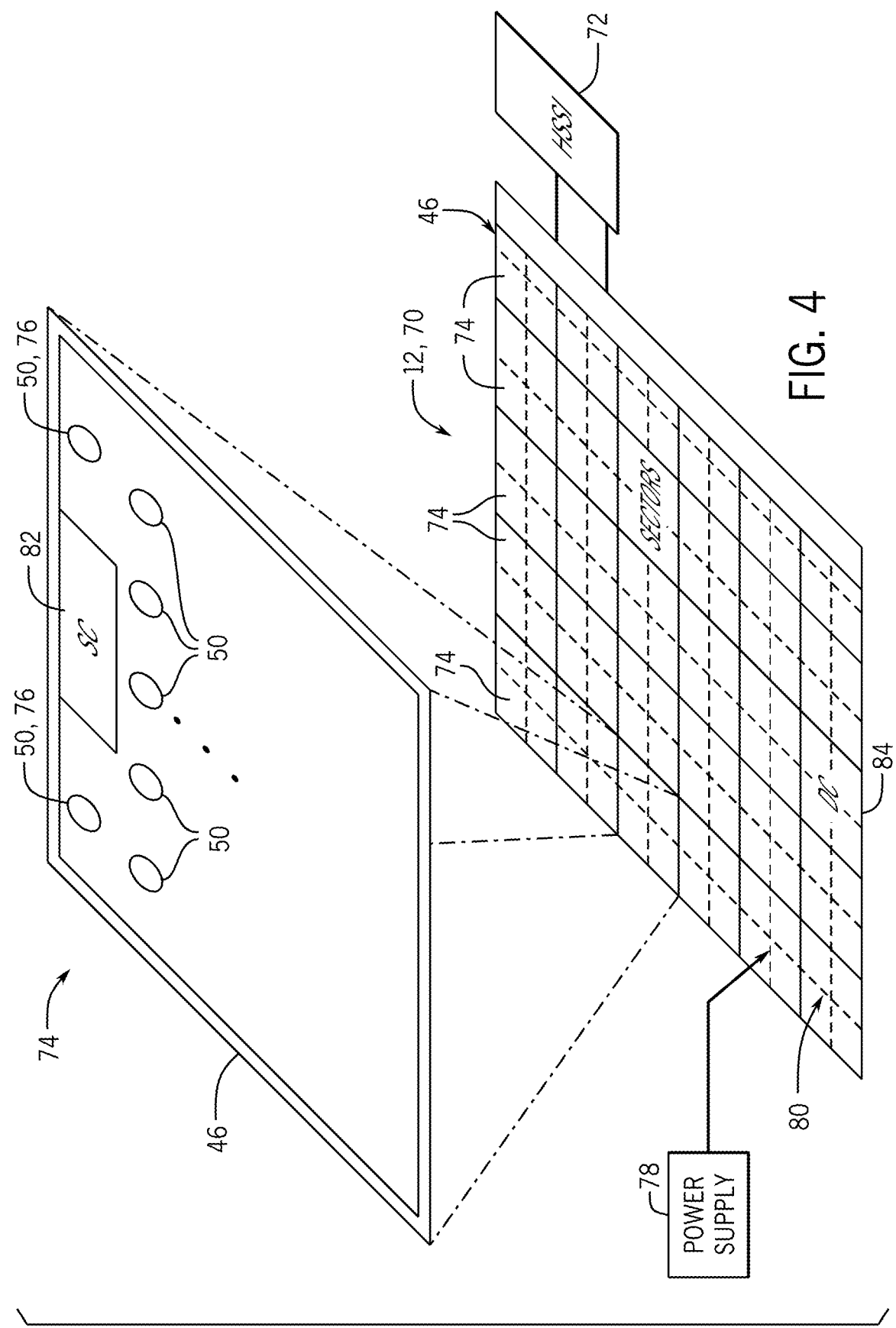
FIG. 4 is a diagram of programmable fabric of the integrated circuit of FIG. 1, in accordance with an embodiment of the present disclosure.

The integrated circuit 12 may include any programmable logic device such as a field programmable gate array (FPGA) 70, as shown in FIG. 4. For the purposes of this example, the FPGA 70 is referred to as an FPGA, though it should be understood that the device may be any suitable type of programmable logic device (e.g., an application-specific integrated circuit and/r application-specific standard product). In one example, the FPGA 70 is a sectorized FPGA. The FPGA 70 may be formed on a single plane. Additionally or alternatively, the FPGA 70 may be a three-dimensional FPGA having a base die and a fabric die.

In the example of FIG. 4, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized in this example, meaning that programmable logic resources may be distributed through a number of discrete programmable logic sectors 74, though in other examples the FPGA may not be sectorized. Programmable logic sectors 74 may include a number of programmable logic elements 50 having operations defined by configuration memory 76 (e.g., CRAM).

A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84, which may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable logic element 50 or programmable component of the interconnection resources 46. The output signals of the configuration memory 76 may be applied to the gates of metal-oxide-semiconductor (MOS) transistors that control the states of the programmable logic elements 50 or programmable components of the interconnection resources 46.

Figure 5:
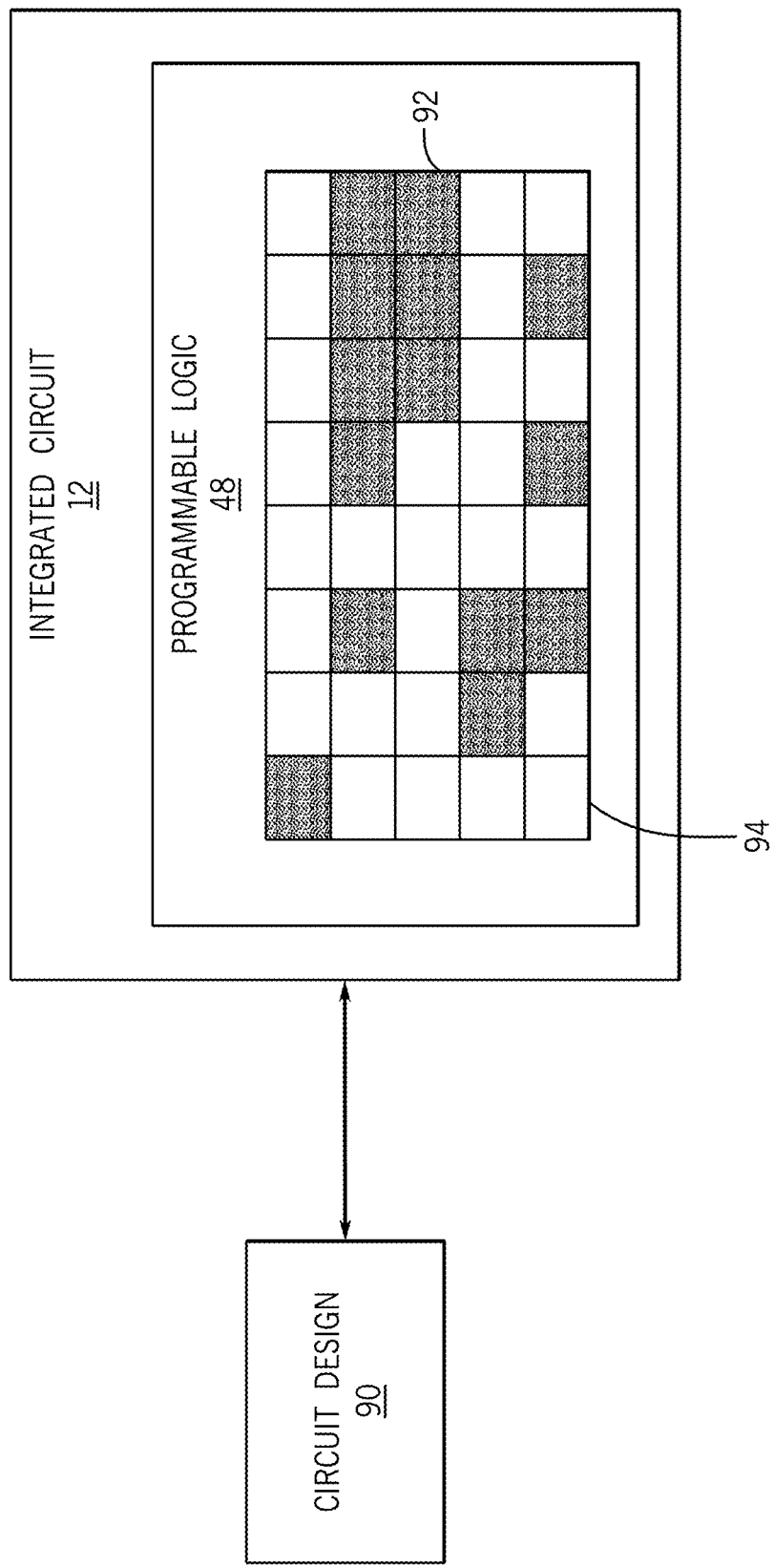
FIG. 5 is a block diagram of a circuit design implemented on the integrated circuit of FIG. 1, in accordance with an embodiment of the present disclosure.

With the foregoing in mind, FIG. 5 is a block diagram of the integrated circuit 12 programmed with a circuit design 90. Once programmed with the circuit design 90, the integrated circuit 12 may include one or more programmed portions 92 of programmable logic 48 and/or one or more unused (e.g., programmed to be unused) portions 94 of programmable logic 48. In some embodiments, the unused portions 94 may be more than half of the programmable logic 48 (e.g., more than 60%, more than 75%, more than 80%, and so forth). It is noted that partial bitstreams may be used to replace portions of implemented circuit designs as opposed to an entire bitstream. The process used to do so may be referred to as a "partial reconfiguration" since a partial portion of the programmable logic 48 is reconfigured. The partial bitstream may be considered a partial configuration file.

Power Management for Programmable Logic Devices

An integrated circuit that contains programmable logic fabric provides a highly flexible platform that can be configured after manufacturing with a custom circuit design. The flexibility and variability in the possible designs that may be programmed into this type of integrated circuit, however, also provides for different sectors of the integrated circuit to be used for different purposes and functions. Additionally or alternatively, different sectors of the integrated circuit may be unused or unutilized when a circuit design is implemented on the integrated circuit. The unused portions 94 of the programmable logic 48 may consume static power, reducing power efficiency of the programmable logic device. Additionally or alternatively, the unused portions 94 of the programmable logic may consume dynamic power. For example, the unused portions 94 may include capacitive elements that may charge and discharge repeatedly.

Programmable logic devices may include circuitry (e.g., logic components) that performs various operations based on a provided voltage and current. In some instances, the voltage and current provided to the circuitry may be cut-off when the programmable logic device and/or portions of the programmable logic device enter a standby mode and/or a powered down mode (e.g., turn-off mode), for example, to reduce battery consumption. During turn-off, current may still flow in portions of the circuitry due to physical attributes of circuit components. For example, one or more transistors (e.g., p-channel metal-oxide-semiconductor (PMOS) transistors, n-channel metal-oxide-semiconductor (NMOS) transistors) may leak some current during standby modes. For instance, the one or more transistors may leak switch-off currents (Ioff) when the one or more transistors are turned off. This leakage current increases power consumption and may result in unwanted electrical behavior, such as charging of portions of the circuitry and/or waste of electrical power.

When portions of the programmable logic device enter a standby mode and/or a powered down mode, components disposed within the portions of the programmable logic may be disabled. In particular, gate terminals of the PMOSs may be coupled (e.g., pulled up) to an external voltage source (e.g., drain-to-drain voltage (VDD)) while a peripheral voltage (VPERI) is used to drive a source terminal of the PMOSs. Once the gate terminal and the source terminal of the PMOS are at nearly equivalent voltages, the PMOS will be effectively off as the voltage difference between the gate terminal and the source terminal (e.g., Vgs) is no longer below an operating voltage threshold. That is, because the potential at the terminals is no longer large enough to drive carriers, active current will not flow through the PMOS.

However, even when the PMOS is effectively off, leakage current may still flow through the transistor. In particular, due to non-ideal behavior of the PMOS, unwanted current may flow through the PMOS device. For example, the leakage current may include current that flows due to formation of a reverse bias between diffusion regions and wells of the PMOS when the PMOS is turned off (e.g., junction leakage). As another example, the leakage current may include current that flows between a drain terminal and the source terminal of the PMOS due to scaling of the supply voltage at the source terminal with transistor size (e.g., subthreshold conduction). Additionally, the leakage current may include current that flows between the terminals due to a breakdown of a dielectric layer at the gate terminal (e.g., gate-oxide leakage). It should be appreciated that while the present disclosure makes reference to a PMOS, any suitable programmable logic components (e.g., NMOS transistor using different polarity connections to its gate terminal) that may be used in the programmable logic fabric are contemplated in the present disclosure.

In some instances, the gate terminals of the PMOS transistors may be coupled to a voltage source having a greater magnitude. As such, the voltage difference between the gate terminal and the source terminal may result in more effective cutoff of the PMOS transistor. Accordingly, the leakage current through the PMOS transistors may be reduced.

Figure 6:
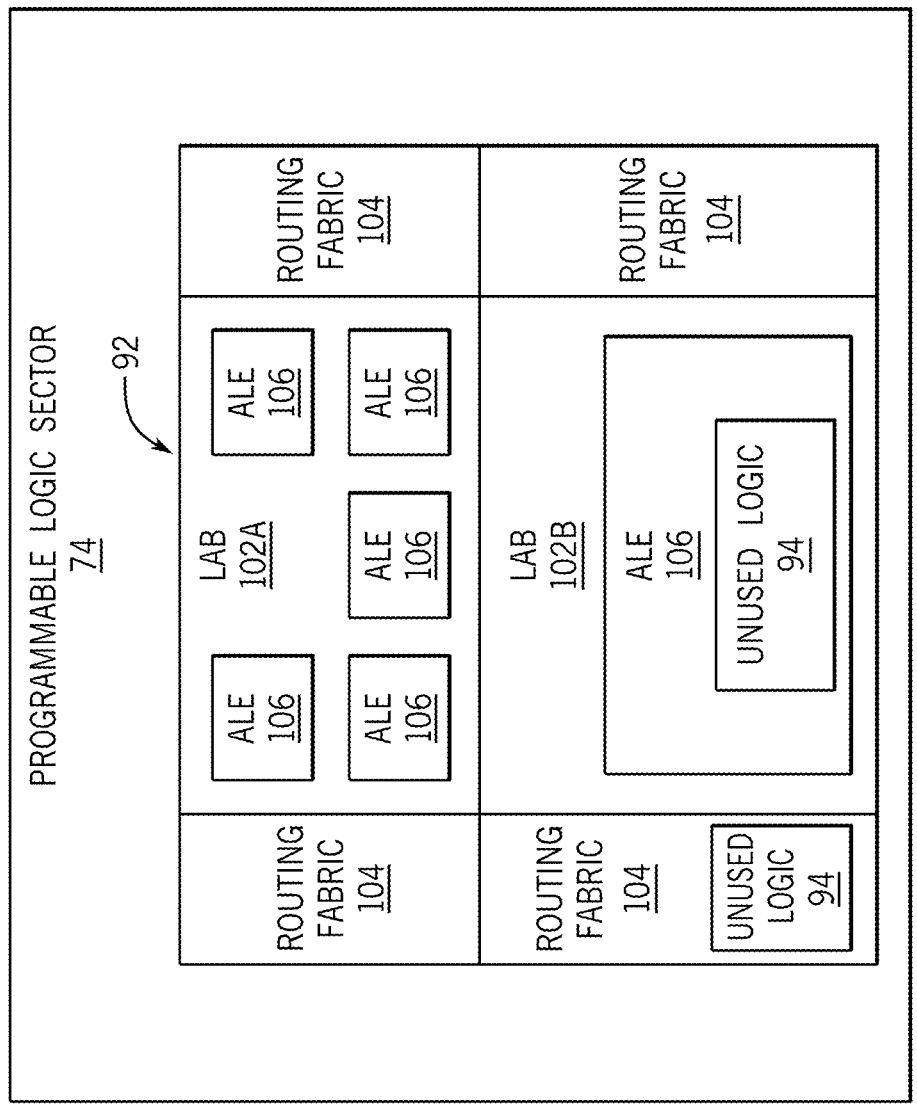
FIG. 6 is a block diagram of a programmable logic sector of the programmable fabric of FIG. 4, in accordance with an embodiment of the present disclosure.

With the foregoing in mind, FIG. 6 is a block diagram of the programmable logic sector 74 including one or more logic array blocks (LABs) 102A, 102B (e.g., two LABs) and the routing fabric 104. The LABs 102A, 102B may be able to interface with the interconnection resources 46. The LABs 102A, 102B may include any number of arithmetic logic element circuitry (ALE) 106 circuits. The LABs 102A, 102B are separated from one another by routing fabric 104 (e.g., configuration random access memory (CRAM), configuration memory). The programmed portions 92 of programmable logic sector 74 may include the first LAB 102A. The ALEs 106 may include combinational logic (e.g., lookup tables), adders, and registers. Additionally or alternatively, the second LAB 102B may include unused portions 94 of programmable logic. ALEs 106 of the labs 102A, 102B may include unused portions 94 of programmable logic. The interconnection resources 46 may include the routing fabric 104. Additionally, the interconnection resources 46 may include routing switches, multiplexers, buffers, and drivers. The multiplexers of the interconnection resources 46 may drive corresponding buffers and consume static power. Additionally or alternatively, the routing fabric 104 may also include unused portions 94 of programmable logic.

Figure 7:
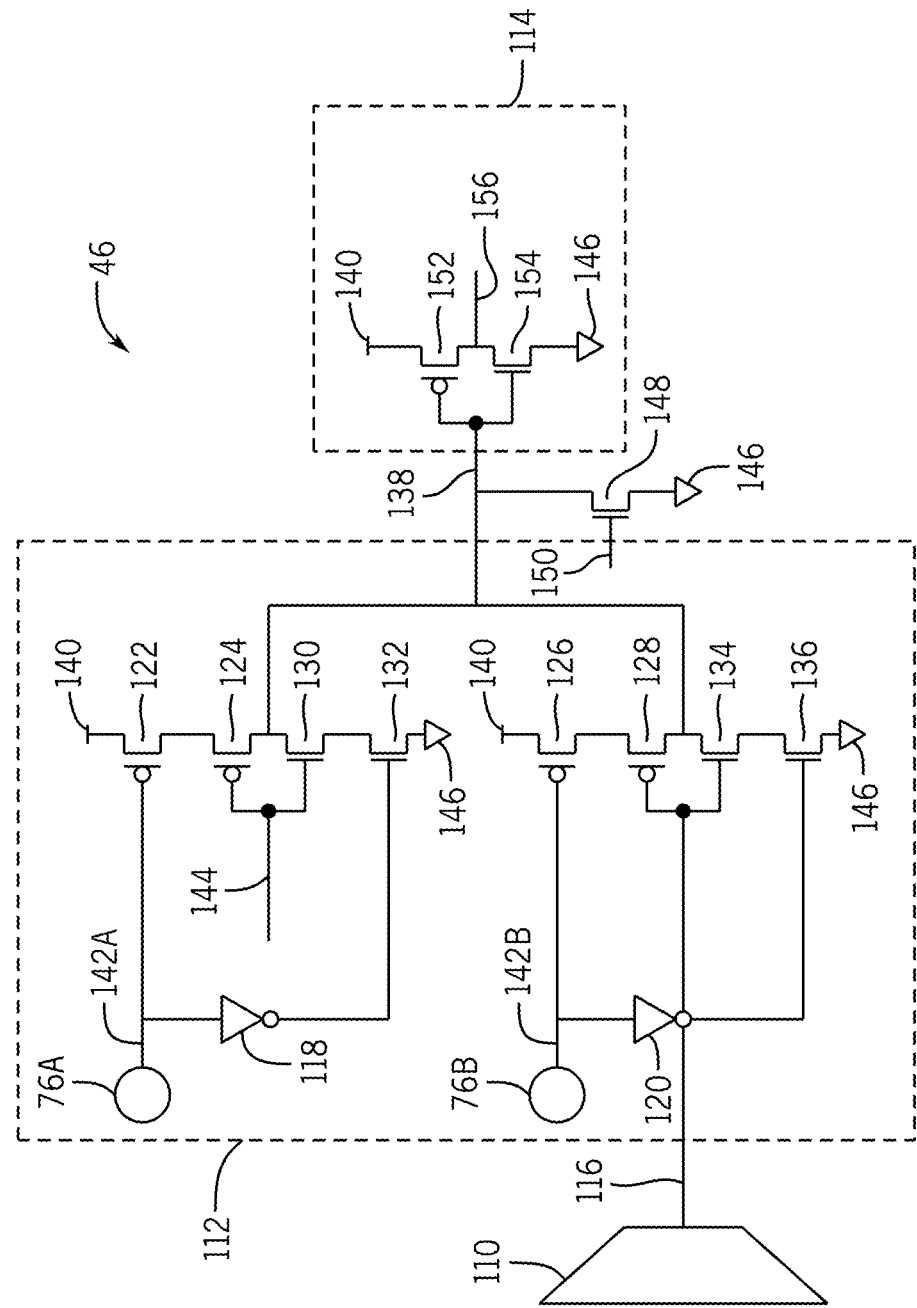
FIG. 7 is a schematic diagram of an example embodiment of interconnection resources of a programmable logic device, in accordance with an embodiment of the present disclosure.

With the foregoing in mind, FIG. 7 illustrates a schematic diagram of an example embodiment of the interconnection resources 46, in accordance with an embodiment of the present disclosure. As shown, the interconnection resources 46 include a routing switch multiplexer 110, a multiplexer 112, and a driver 114. The routing switch multiplexer 110 may generate an output signal 116. In some embodiments, the multiplexer 112 may include a 2 to 1 multiplexer. The multiplexer 112 may include a number of components, such as inverters 118, 120, P-channel metal-oxide-semiconductor (PMOS) transistors 122, 124, 126, 128, and N-channel metal-oxide-semiconductor (NMOS) transistors 130, 132, 134, 136. The multiplexer 112 may receive the output signal 116. A gate terminal of the PMOS transistor 128 and a gate terminal of the NMOS transistor 134 may be coupled to the output signal 116. A drain terminal of the PMOS transistor 128 and a drain terminal of the NMOS transistor 134 may be coupled to an output signal 138 of the multiplexer 112. A source terminal of the PMOS transistor 128 may be coupled to a drain terminal of the PMOS transistor 126. A source terminal of the PMOS transistor 126 may be coupled to a first voltage supply 140. A gate terminal of the PMOS transistor 122 and a gate terminal of the PMOS transistor 126 may be coupled to configuration memory 76A, 76B, respectively. The configuration memory 76A, 76B may provide a second voltage supply via enable signals 142A, 142B that may have a greater voltage magnitude than the first voltage supply 140. A drain terminal of the PMOS transistor 122 may be coupled to a source terminal of the PMOS transistor 124. A gate terminal of the PMOS transistor 124 and a gate terminal of the NMOS transistor 130 may be coupled to a signal 144. In certain embodiments, the signal 144 may be an output signal of a corresponding routing switch multiplexer. A drain terminal of the PMOS transistor 124 and a drain terminal of the NMOS transistor 130 may be coupled to the output signal 138. A source terminal of the NMOS transistor 130 may be coupled to a drain terminal of the NMOS transistor 132. A source terminal of the NMOS transistor 132 and a source terminal of the NMOS transistor 136 may be tied to 0 volts (e.g., ground 146). An input terminal of the inverter 118 and an input terminal of the inverter 120 may be coupled to the configuration memory 76A, 76B, respectively. An output terminal of the inverter 118 may be coupled to a gate terminal of the NMOS transistor 132. An output terminal of the inverter 120 may be coupled to the gate terminal of the NMOS transistor 136.

The interconnection resources 46 may also include an NMOS transistor 148. A gate terminal of the NMOS transistor 148 may be coupled to a control signal 150. A source terminal of the NMOS transistor 148 may be coupled to ground 146. A drain terminal of the NMOS transistor 148 may be coupled to the output signal 138. The driver 114 may include a number of logic components, such as PMOS transistor 152 and NMOS transistor 154. A gate terminal of the PMOS transistor 152 and a gate terminal of the NMOS transistor 154 may be coupled to the output signal 138. A drain terminal of the PMOS transistor 152 and a drain terminal of the NMOS transistor 154 may be coupled to an output signal 156 of the driver 114. A source terminal of the PMOS transistor 152 may be coupled to the first voltage supply 140. A source terminal of the NMOS transistor 154 may be coupled to ground 146.

Figure 8:
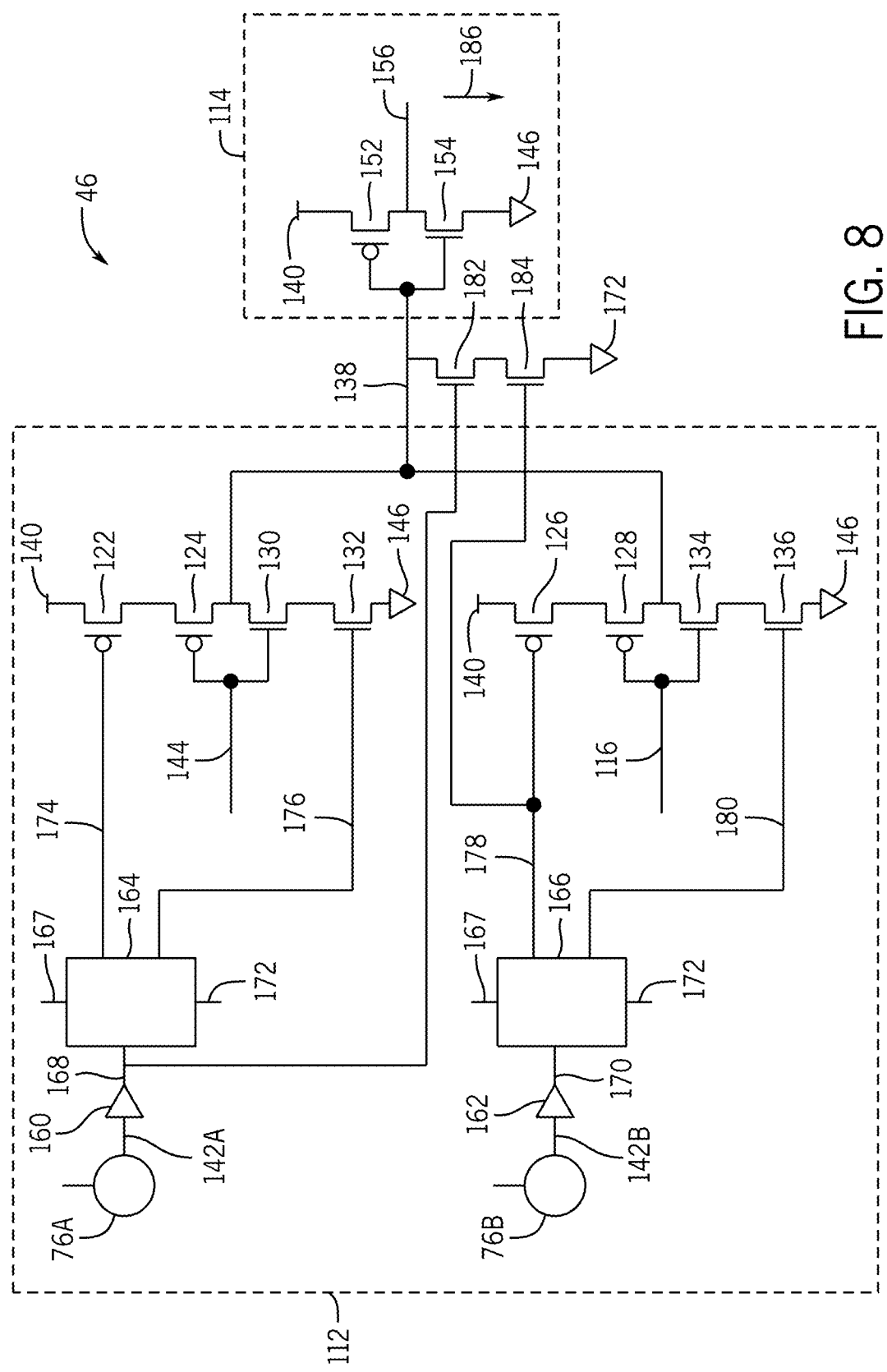
FIG. 8 is a schematic diagram of another example embodiment of interconnection resources of a programmable logic device, in accordance with an embodiment of the present disclosure.

As discussed above, leakage current through the N-channel metal-oxide-semiconductor (NMOS) transistors may be reduced by providing a negative, underdriven voltage source to a gate terminal of the NMOS transistors. Additionally or alternatively, leakage current through the P-channel metal-oxide-semiconductor (PMOS) transistors may be reduced by providing a positive, overdriven voltage source to a gate terminal of the PMOS transistors. As such, the voltage difference between the gate terminal and the source terminal may result in more effective cutoff of the transistors. The configuration memory 76A, 76B may generate enable signals 142A, 142B to control the operation of the interconnection resources 46. For example, the enable signals 142A, 142B may place the driver 114 in a low power mode to reduce static power consumption, as described herein. With the foregoing in mind, FIG. 8 illustrates a schematic diagram of another example embodiment of the interconnect resources 46, in accordance with an embodiment of the present disclosure. As shown, the interconnection resources include the multiplexer 112 and the driver 114. The multiplexer 112 may include PMOS transistors 122, 124, 126, 128, NMOS transistors 130, 132, 134, 136, buffer logic gates 160, 162, and level shifters 164, 166. The buffer logic gates 160, 162 may control operation of the corresponding level shifter 164, 166 by providing corresponding output signals 168, 170. An input terminal of the first buffer logic gate 160 and an input terminal of the second buffer logic gate 162 may be coupled to the configuration memory 76A, 76B, respectively. The first buffer logic gate 160 may generate the output signal 168 and an input terminal of the first level shifter 164 may receive the output signal 168. The second buffer logic gate 162 may generate the output signal 170 and an input terminal of the second level shifter 166 may receive the output signal 170.

A power terminal of the first level shifter 164 and a power terminal of the second level shifter 166 may be coupled to a second voltage supply 167. In certain embodiments, the second voltage supply 167 may be a positive and/or an overdriven voltage supply. For example, the second voltage supply 167 may be greater than the first voltage supply 140. The second voltage supply 167 may be greater than 0.5 volts (e.g., 0.7 volts, 0.9 volts, 1.0 volts, and so forth). A ground terminal of the first level shifter 164 and a ground terminal of the second level shifter 166 may be coupled to a third voltage supply 172. In some embodiments, the third voltage supply 172 may be less than 0 volts (e.g., −0.05 volts, −0.1 volts, −0.15 volts, and so forth). As such, the third voltage supply 172 may provide a negative and/or an underdriven voltage to gate terminals of the NMOS transistors. The first level shifter 164 may provide the second voltage supply 167 and/or the third voltage supply 172 as outputs based on the output signal 168. For example, the gate terminal of the PMOS transistor 122 may be coupled to a first output terminal of the first level shifter 164 providing the output signal 174. The output signal 174 may provide the second voltage supply 167 to the gate terminal of the PMOS transistor 122. The gate terminal of the NMOS transistor 132 may be coupled to a second output terminal of the first level shifter 164 providing the output signal 176. The output signal 176 may provide the third voltage supply 172 to the gate terminal of the NMOS transistor 132. The second level shifter 166 may provide the second voltage supply 167 and/or the third voltage supply 172 as outputs based on the output signal 170. For example, the gate terminal of the PMOS transistor 126 may be coupled to a first output terminal of the second level shifter 166 providing the output signal 178. The output signal 178 may provide the second voltage supply 167 to the gate terminal of the PMOS transistor 126. The gate terminal of the NMOS transistor 136 may be coupled to a second output terminal of the second level shifter 166 providing the output signal 180. The output signal 180 may provide the third voltage supply 172 to the gate terminal of the NMOS transistor 136.

The interconnection resources 46 may also include NMOS transistors 182, 184. A gate terminal of the NMOS transistor 182 may be coupled to the output signal 174. A drain terminal of the NMOS transistor 182 may be coupled to the output signal 138 of the multiplexer 112. A source terminal of the NMOS transistor 182 may be coupled to a drain terminal of the NMOS transistor 184. A gate terminal of the NMOS transistor 184 may be coupled to the output signal 178. A source terminal of the NMOS transistor 184 may be coupled to the third voltage supply 172. The configuration of the multiplexer 112 and driver 114 in FIG. 8 corresponds to when the output signal 156 is high (e.g., 0.5 volts, 0.7 volts, 1.0 volts) when the driver 114 is not being used. Accordingly, the default state (e.g., unused state) for the output signal 156 is high. As such, the third voltage supply 172 may be provided to the gate terminal of the NMOS transistor 154 to reduce leakage current 186 through the NMOS transistor 154. Accordingly, the output signal 138 may provide the third voltage supply 172 to the gate terminal of the NMOS transistor 154 to reduce the leakage current 186. The configuration memory 76A, 76B may control operation of the driver 114 to place the driver 114 in the low-power mode (e.g., reduce leakage current 186).

Figure 9:
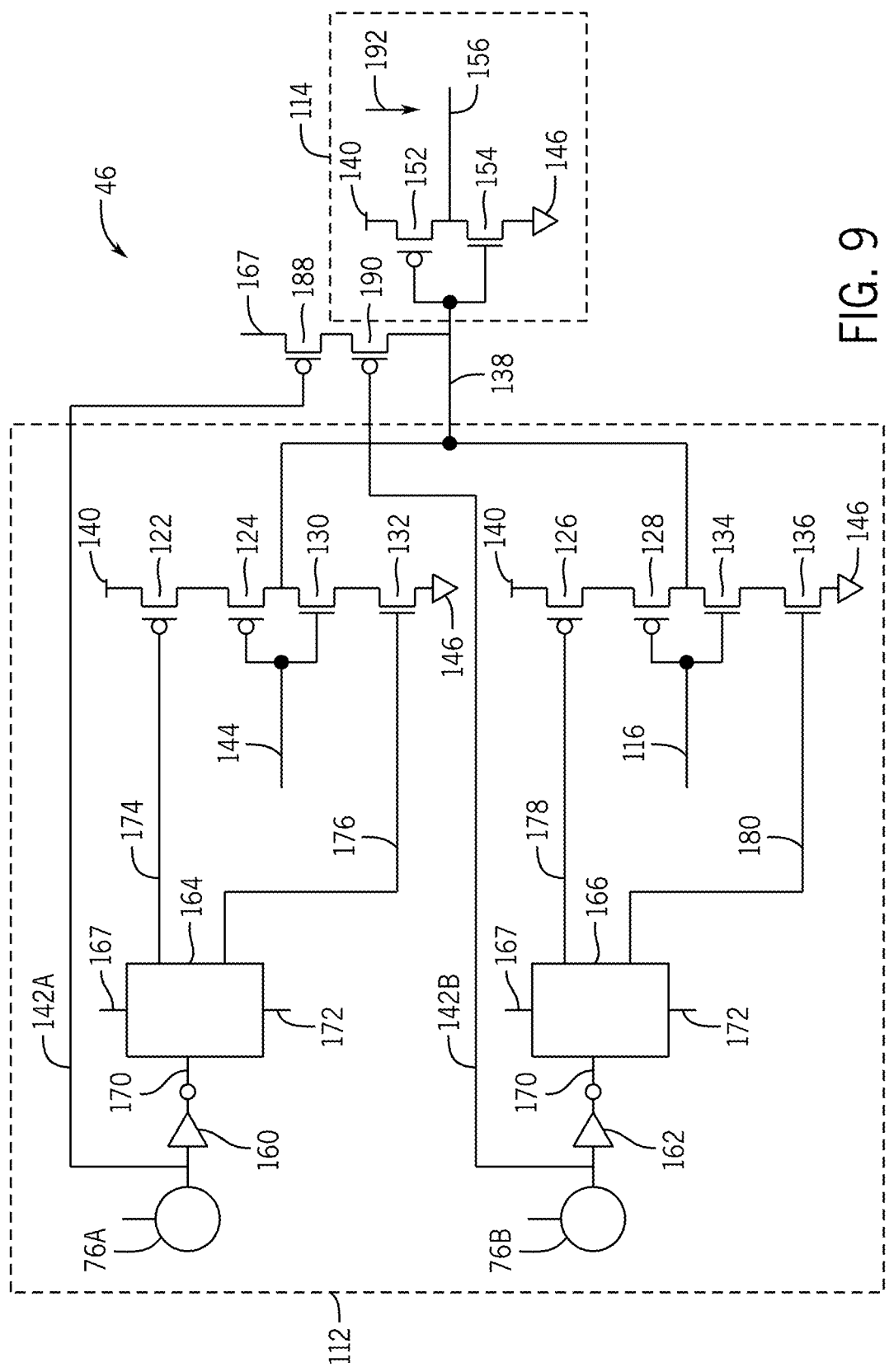
FIG. 9 is a schematic diagram of another example embodiment of interconnection resources of a programmable logic device, in accordance with an embodiment of the present disclosure.

When the unused state for the output signal 156 corresponds to a high signal, the configuration of the multiplexer 112 and driver 114 described above in FIG. 8 may be utilized. However, when the unused state for the output signal 156 corresponds to a low signal (e.g., 0 volts), a different configuration of the multiplexer 112 and driver 114 may be utilized. With the foregoing in mind, FIG. 9 is a schematic diagram of an example embodiment of the interconnection resources 46, in accordance with an embodiment of the present disclosure. The interconnection resources may include the multiplexer 112, the driver 114, and PMOS transistors 188, 190. A gate terminal of the PMOS transistor 188 may be coupled to the enable signal 142A output by the configuration memory 76A. A gate terminal of the PMOS transistor 190 may be coupled to the enable signal 142B output by the configuration memory 76B. A source terminal of the PMOS transistor 188 may be coupled to the second voltage supply 167. A drain terminal of the PMOS transistor 188 may be coupled to a source terminal of the PMOS transistor 190. A drain terminal of the PMOS transistor 190 may be coupled to the output signal 138. The configuration of the multiplexer 112 and driver 114 in FIG. 8 corresponds to when the output signal 156 is low (e.g., 0 volts) when the driver 114 is not being used. Accordingly, the unused state for the output signal 156 is low. As such, the second voltage supply 167 may be provided to the gate terminal of the PMOS transistor 152 to reduce leakage current 192 through the PMOS transistor 152. Accordingly, the output signal 138 may provide the second voltage supply 167 to the gate terminal of the PMOS transistor 152 to reduce the leakage current 192. The configuration memory 76A, 76B may control operation of the driver 114 to place the driver 114 in the low-power mode (e.g., reduce leakage current 192).

Figure 10:
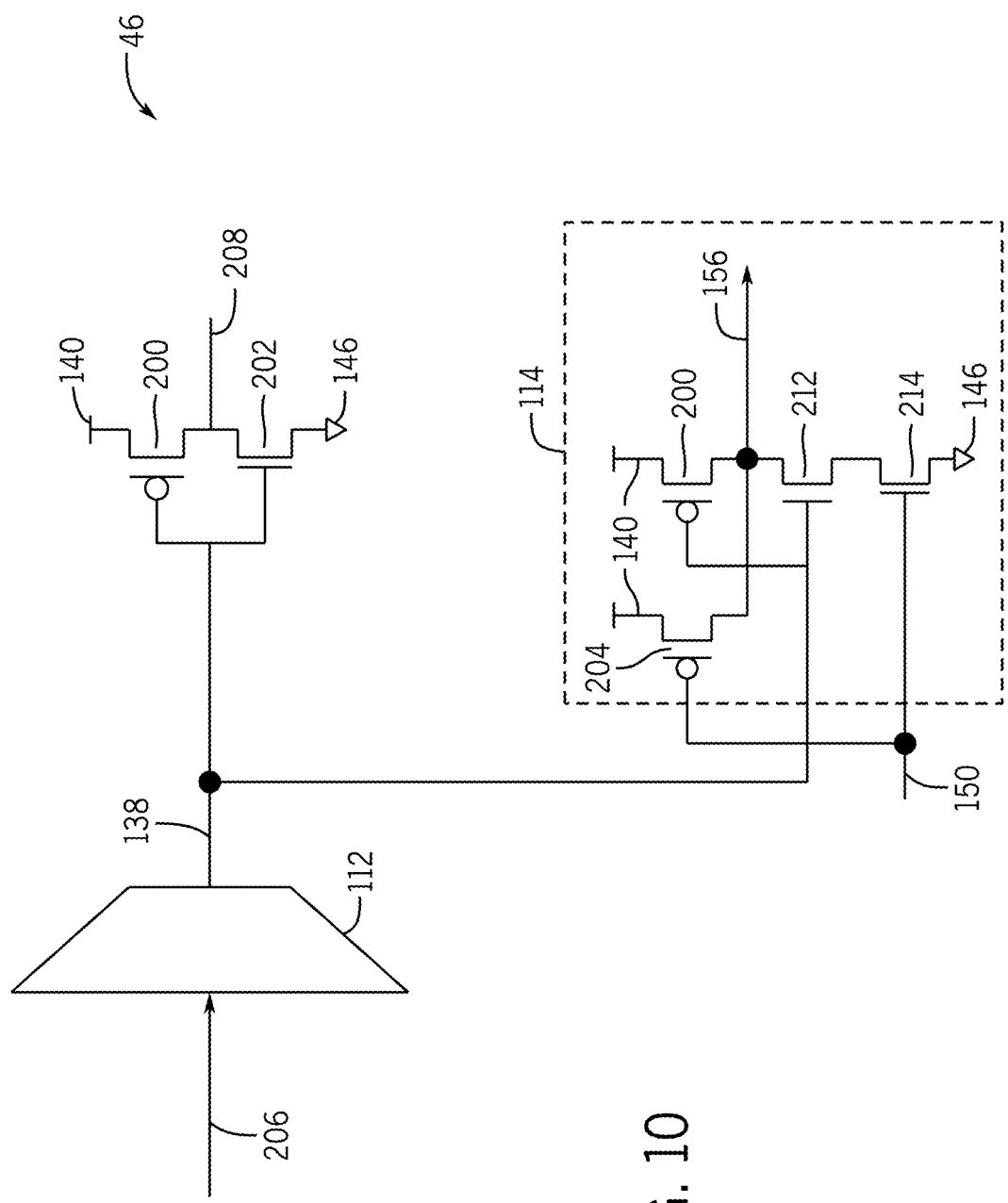
FIG. 10 is a schematic diagram of another example embodiment of interconnection resources of a programmable logic device, in accordance with an embodiment of the present disclosure.

With the foregoing in mind, FIG. 10 is a schematic diagram of another example embodiment of the interconnection resources 46, in accordance with an embodiment of the present disclosure. The interconnection resources 46 may include the multiplexer 112, the driver 114, PMOS transistor 200 and NMOS transistor 202. The multiplexer 112 may receive an input signal 206. In some embodiments, the input signal 206 may be an output of a lookup table. The multiplexer 112 may generate and output the output signal 138. A gate terminal of the PMOS transistor 200 and a gate terminal of the NMOS transistor 202 may be coupled to the output signal 138. A drain terminal of the PMOS transistor 200 and a drain terminal of the NMOS transistor 202 may be coupled to an output signal 208. A source terminal of the PMOS transistor 200 may be coupled to the first voltage supply 140. A source terminal of the NMOS transistor may be coupled to ground 146 (e.g. 0 volts). A gate terminal of the PMOS transistor 204 may be coupled to the control signal 150. In some embodiments, the control signal 150 may be output by configuration memory 76 to control operation of the driver 114. For example, the configuration memory 76 may output the control signal 150 to enable and/or disable the driver 114. A source terminal of the PMOS transistor 204 may be coupled to the first voltage supply 140. A drain terminal of the PMOS transistor 204 may be coupled to the output signal 156 of the driver 114. The driver 114 may include the PMOS transistor 204, PMOS transistor 210, and NMOS transistors 212, 214. A gate terminal of the PMOS transistor 210 and a gate terminal of the NMOS transistor 212 may be coupled to the output signal 138. A drain terminal of the PMOS transistor 210 and a drain terminal of the NMOS transistor 212 may be coupled to the output signal 156. A source terminal of the PMOS transistor 210 may be coupled to the first voltage supply 140. A source terminal of the NMOS transistor 212 may be coupled to a drain terminal of the NMOS transistor 214. A gate terminal of the NMOS transistor 214 may be coupled to the control signal 150. A source terminal of the NMOS transistor 214 may be coupled to ground 146.

Figure 11A:
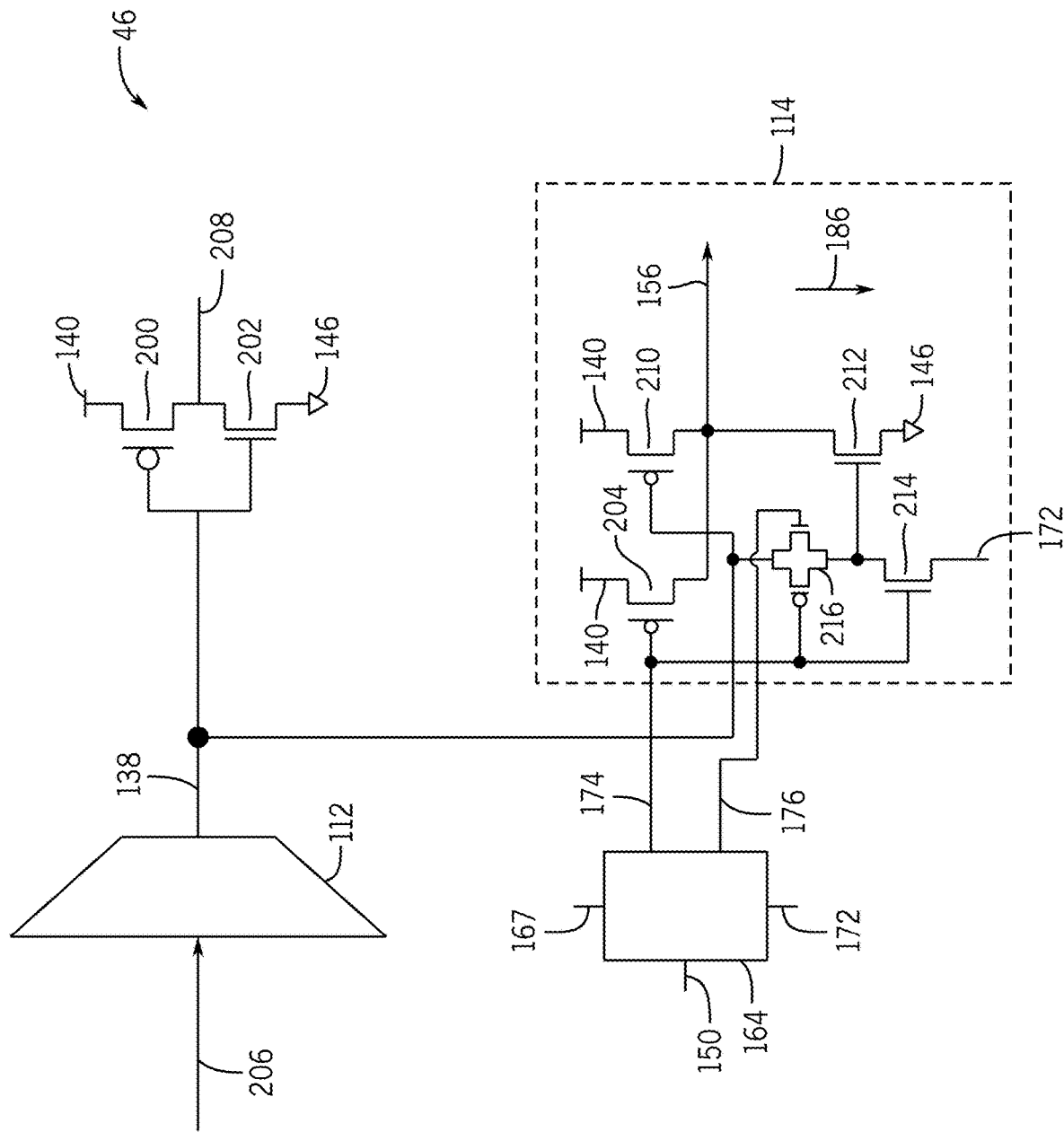
FIG. 11A is a schematic diagram of schematic diagram of another example embodiment of interconnection resources of a programmable logic device, in accordance with an embodiment of the present disclosure.

With the foregoing in mind, FIG. 11A is a schematic diagram of another example embodiment of the interconnection resources 46, in accordance with an embodiment of the present disclosure. The interconnection resources 46 may include the multiplexer 112, the driver 114, the level shifter 164, the PMOS transistor 200, and the NMOS transistor 202. The control signal 150 may control operation of the level shifter 164. The control signal 150 may be provided by the configuration memory 76. An input terminal of the level shifter 164 may receive the control signal 150. A power terminal of the level shifter 164 may be coupled to the second voltage supply 167. A ground terminal of the level shifter 164 may be coupled to the third voltage supply 172. The level shifter 164 may provide the second voltage supply 167 and/or the third voltage supply 172 as outputs based on the control signal 150. For example, the gate terminal of the PMOS transistor 204 may be coupled to a first output terminal of the level shifter 164 providing the output signal 174. The output signal 174 may provide the second voltage supply 167 to the gate terminal of the PMOS transistor 204. The driver 114 may include the PMOS transistors 204, 210, the NMOS transistors 212, 214, and a transmission gate 216. The transmission gate 216 may control operation of the NMOS transistor 212. For example, the transmission gate 216 may isolate the output signal 138 from the gate terminal of the NMOS transistor 212. Accordingly, the third voltage supply 172 may be provided to the NMOS transistor 212 via the output signal 176 and the transmission gate 216. By providing the third voltage supply 172 to the NMOS transistor 212, the configuration memory 76 may control operation (e.g., control signal 150) of the driver 114 to reduce the leakage current 186. For example, the configuration memory 76 may control operation of the driver 114 to place the driver 114 in the low-power mode (e.g., reduce leakage current 186).

Additionally or alternatively, the transmission gate 216 may reduce dynamic power consumption from charging and discharging of the NMOS transistor 212. For example, the transmission gate 216 may provide the output signal 138 to the gate terminal of the NMOS transistor 212. When the output signal 138 switches between high and low, the NMOS transistor 212 may discharge capacitance. As such, the NMOS transistor 212 may consume dynamic power. The transmission gate 216 may control supply of the output signal 138 to the gate terminal of the NMOS transistor 212, thereby preventing repeated charging and discharging of the capacitance of the NMOS transistor 212. Accordingly, the transmission gate 216 may reduce dynamic power consumption from the NMOS transistor 212. While FIG. 11A illustrates an NMOS transistor, reduction of dynamic power consumption by PMOS transistor(s), NMOS transistor(s), or any combination thereof may be accomplished using the techniques described herein. Thus, the embodiments are intended to be illustrative and not limiting.

Figure 11B:
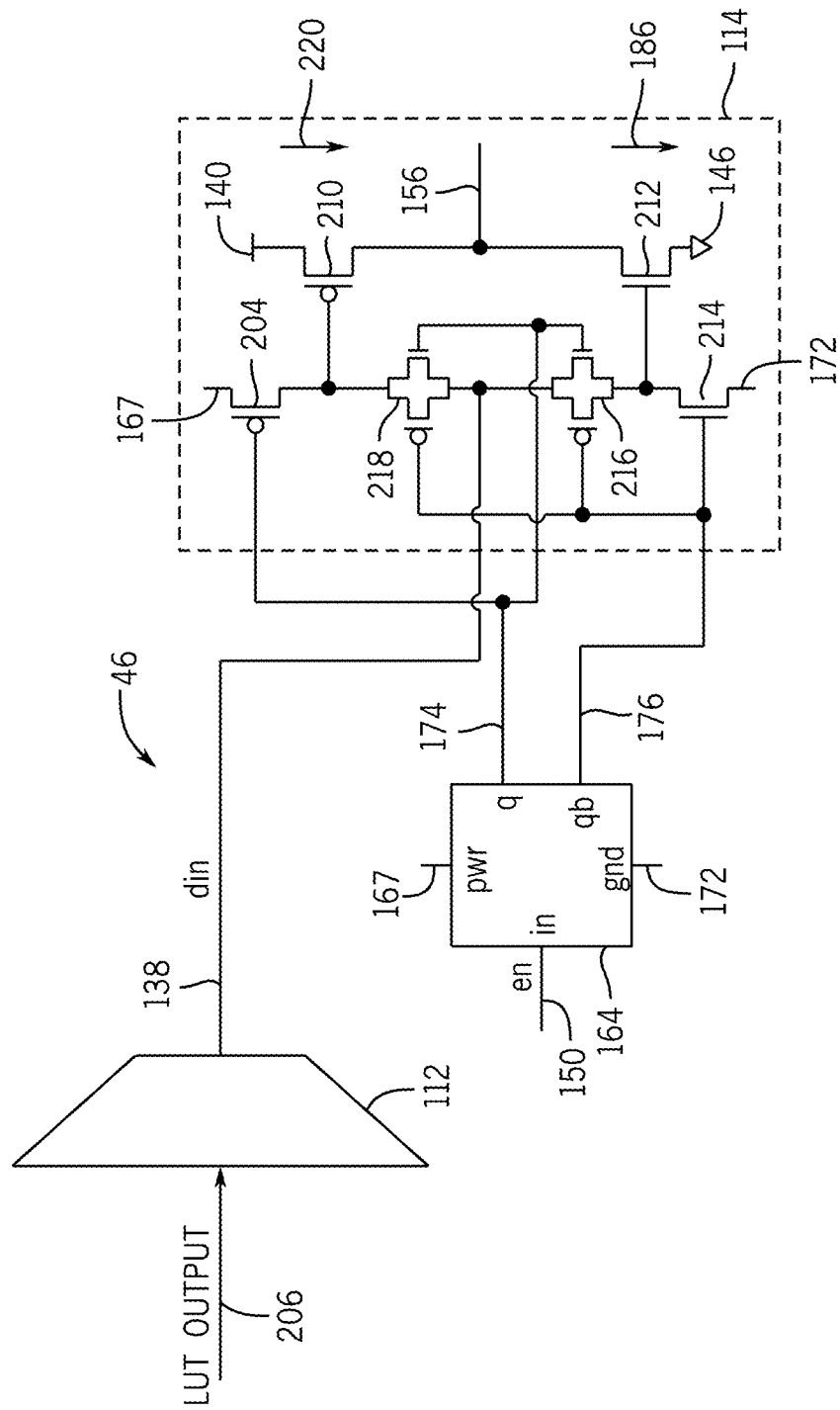
FIG. 11B is a schematic diagram of another example embodiment of interconnection resources of a programmable logic device, in accordance with an embodiment of the present disclosure.

In certain instances, the output 156 and/or the input 138 may be unknown when the driver 114 is in the unused state. As such, the interconnection resources 46 may include a driver 114 that may be utilized in instances when the output 156 and/or the input 138 in the unused state may be high or low. As such, the interconnection resources may accommodate a tristate implementation of the driver 114. Additionally or alternatively, the output 156 and/or the input may be toggling between high and low when the low-power mode is implemented. With the foregoing in mind, FIG. 11B is a schematic diagram of another example embodiment of the interconnection resources 46, in accordance with an embodiment of the present disclosure. The interconnection resources 46 may include the multiplexer 112, the driver 114, and the level shifter 164. The control signal 150 may control operation of the level shifter 164. The control signal 150 may be provided by the configuration memory 76. The level shifter 164 may provide the second voltage supply 167 and/or the third voltage supply 172 as outputs based on the control signal 150. For example, the gate terminal of the PMOS transistor 204 may be coupled to a first output terminal of the level shifter 164 providing the output signal 174. The output signal 174 may provide the second voltage supply 167 to the gate terminal of the PMOS transistor 204.

The driver 114 may include the PMOS transistors 204, 210, the NMOS transistors 212, 214, and a transmission gate 216. The transmission gate 216 may control operation of the NMOS transistor 212. For example, the transmission gate 216 may isolate the output signal 138 from the gate terminal of the NMOS transistor 212. Accordingly, the third voltage supply 172 may be provided to the NMOS transistor 212 via the output signal 176 and the transmission gate 216. By providing the third voltage supply 172 to the NMOS transistor 212, the configuration memory 76 may control operation (e.g., control signal 150) of the driver 114 to reduce the leakage current 186. For example, the configuration memory 76 may control operation of the driver 114 to place the driver 114 in the low-power mode (e.g., reduce leakage current 186). The driver 114 may also include the transmission gate 218. The transmission gate 218 may control operation of the PMOS transistor 210. For example, the transmission gate 218 may isolate the output signal 138 from the gate terminal of the PMOS transistor 210. Accordingly, the second voltage supply 167 may be provided to the gate terminal of the PMOS transistor 210 via the output signal 174 and the transmission gate 218. By providing the second voltage supply 167 to the PMOS transistor 210, the configuration memory 76 may control operation of the driver 114 to reduce a leakage current 220 through the PMOS transistor 210.

As such, the configuration memory 76 may control operation of the driver 114 to place the driver 114 in the low-power mode (e.g., reduce the leakage current 220 or the leakage current 186 based on the value of the output 156 in the unused state.) Additionally or alternatively, the interconnection resources 46 may include the transmission gate 218 without the transmission gate 216 when the output 156 is low in the unused state. As such, the transmission gate 218 may control operation of the PMOS transistor 210 to reduce the leakage current 220.

Additionally or alternatively, the transmission gate 216 may reduce dynamic power consumption from charging and discharging of the NMOS transistor 212. For example, the transmission gate 216 may provide the output signal 138 to the gate terminal of the NMOS transistor 212. When the output signal 138 switches between high and low, the NMOS transistor 212 may discharge capacitance. As such, the NMOS transistor 212 may consume dynamic power. The transmission gate 216 may control supply of the output signal 138 to the gate terminal of the NMOS transistor 212, thereby preventing repeated charging and discharging of the capacitance of the NMOS transistor 212. Accordingly, the transmission gate 216 may reduce dynamic power consumption from the NMOS transistor 212. While FIG. 11A illustrates an NMOS transistor, reduction of dynamic power consumption by PMOS transistor(s), NMOS transistor(s), or any combination thereof may be accomplished using the techniques described herein. Thus, the embodiments are intended to be illustrative and not limiting.

Figure 12:
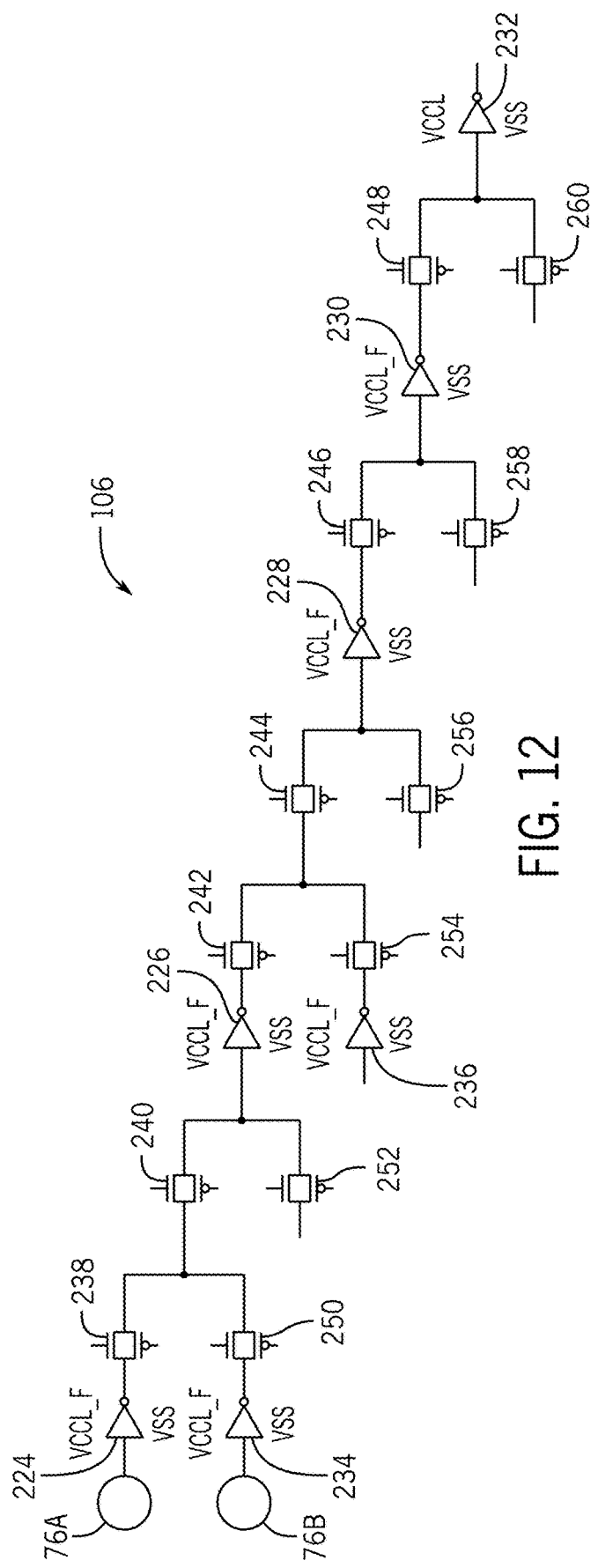
FIG. 12 is a schematic diagram of an example embodiment of an arithmetic logic element of a programmable logic device, in accordance with an embodiment of the present disclosure.

Additionally or alternatively, power gating techniques may be utilized to power gate rails of the integrated circuit 12. The integrated circuit 12 may include power rails and ground rails to provide power to components of the programmable logic fabric. Lookup tables disposed in the ALEs 106 may be powered down to reduce static power consumption in unused portions 94 of the programmable logic. In some embodiments, power gating circuitry may be utilized on the power rails or the ground rails. As such, the unused ALEs may be placed in the low-power mode by power gating. With the foregoing in mind, FIG. 12 is a schematic diagram of an example embodiment of the ALE 106, in accordance with an embodiment of the present disclosure. A power supply, VCCL_F, may be a power gated version of the power supply, VCCL. For example, the power gated version of the power supply may be power gated by a header and/or a footer transistor. The ALE 106 may include any number of components, such as inverters 224, 226, 228, 230, 232, 234, 236 and transmission gates 238, 240, 242, 244, 246, 248, 250, 252, 256, 258, 260. An input terminal of the inverter 224 may be coupled to the configuration memory 76A. An input terminal of the transmission gate 238 may be coupled to an output terminal of the inverter 224. An input terminal of the transmission gate 240 may be coupled to an output terminal of the transmission gate 238 and an output terminal of the transmission gate 250. An input terminal of the inverter 226 may be coupled to an output terminal of the transmission gate 240 and an output terminal of the transmission gate 252. An output terminal of the inverter 226 may be coupled to an input terminal of the transmission gate 242. An input terminal of the transmission gate 244 may be coupled to an output terminal of the transmission gate 242 and an output terminal of the transmission gate 254. An input terminal of the inverter 228 may be coupled to an output terminal of the transmission gate 244 and an output terminal of the transmission gate 256. An input terminal of the transmission gate 246 may be coupled to an output terminal of the inverter 228. An input terminal of the inverter 230 may be coupled to an output terminal of the transmission gate 246 and an output terminal of the transmission gate 258. An input terminal of the transmission gate 248 may be coupled to an output terminal of the inverter 230. An input terminal of the inverter 232 may be coupled to an output terminal of the transmission gate 248 and an output terminal of the transmission gate 260. An input terminal of the inverter 234 may be coupled to the configuration memory 76B. An output terminal of the inverter 234 may be coupled to an input terminal of the transmission gate 250. An output terminal of the inverter 236 may be coupled to an input terminal of the transmission gate 254.

Figure 13:
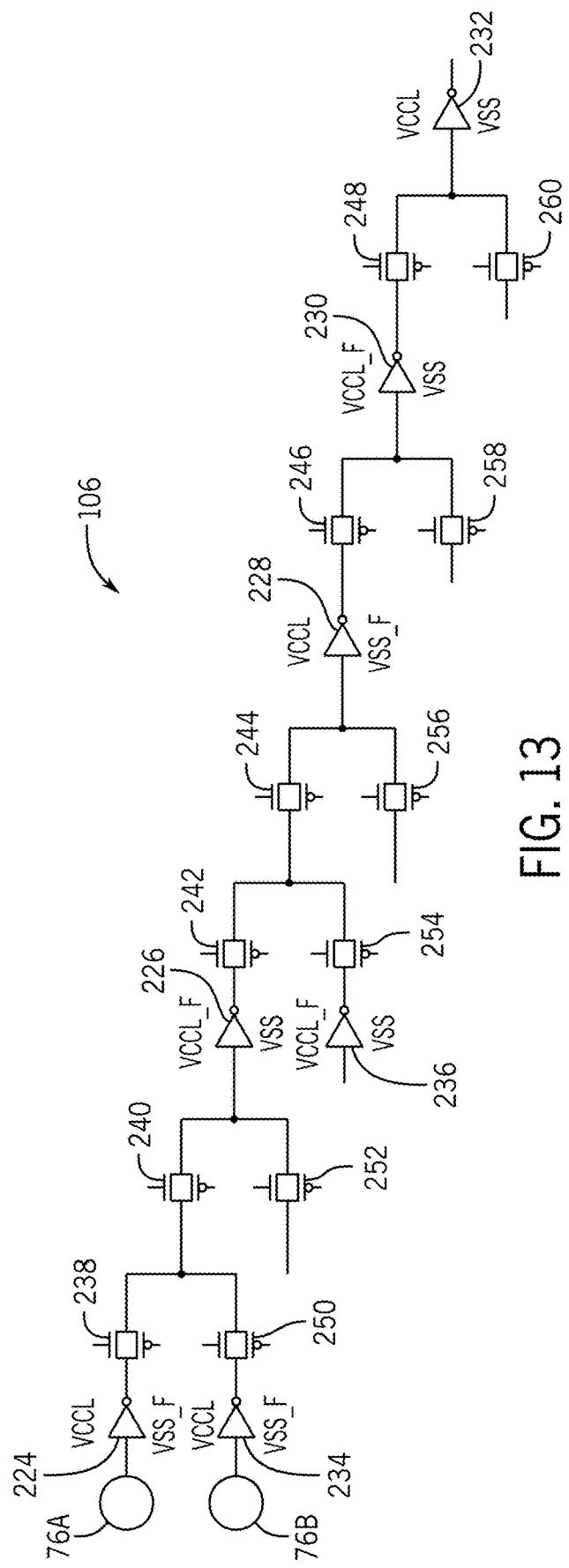
FIG. 13 is a schematic diagram of another example embodiment of the arithmetic logic element, in accordance with an embodiment of the present disclosure.

By alternating placement of the power rail and the ground rail, lookup tables disposed in the ALEs 106 may be powered down to reduce static power consumption in unused portions 94 of the programmable logic 48. With the foregoing in mind, FIG. 13 illustrates another example embodiment of the ALE 106, in accordance with an embodiment of the present disclosure. Power gating circuitry may be utilized on both the power rail and the ground rail. A voltage supply (e.g., ground, VSS) may be power gated by one or more transistors. For example, a voltage supply, VSS_F, may be a power gated version of the voltage supply, VSS. In some embodiments, the power gating circuitry may include one or more MOS transistors, such as a PMOS transistor, an NMOS transistor, or a combination thereof. For example, the power gating circuitry may include a header PMOS transistor to implement the low-power mode for the ALE 106. Additionally or alternatively, the power gating circuitry may include a footer NMOS transistor to implement the low-power mode for the ALE 106. By alternating power gating for the power rail and the ground rail, floating nodes may be eliminated and alternating current surges may be reduced when enabling and/or disabling the low-power mode. Additionally or alternatively, power gating techniques may utilize backside metal of the programmable logic device to implement the power rails and the ground rails.

Figure 14:
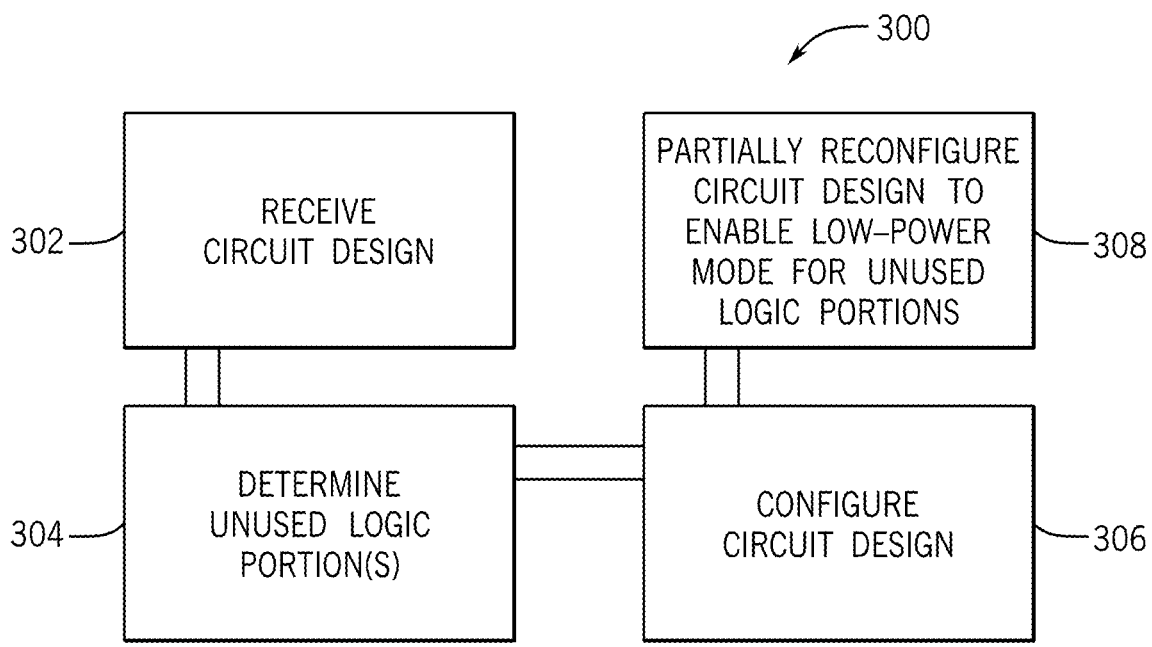
FIG. 14 is a process for reconfiguration of a programmable logic device to reduce power consumption of the programmable logic device, in accordance with an embodiment of the present disclosure.

In certain embodiments, a designer may determine one or more portions of the programmable logic 48 may be unused for a predetermined time period. For example, the one or more unused portions 94 may correspond to functions and/or operations that are not available during the predetermined time period. As such, the unused portions 94 may be placed in the low-power mode for at least the predetermined time period. For example, the user may control operation of the unused portions 94 and may reduce power consumption of the programmable logic device by placing the unused portions 94 in the low-power mode. Additionally or alternatively, the designer may determine one or more predetermined time periods when portions of the programmable logic are unused based on past operation of the integrated circuit 12. The design software 14 may analyze the circuit design 90 and may enable the low-power mode for unused portions 94 of the programmable logic. Additionally or alternatively, the design software 14 may modify the circuit design 90 to optimize power reduction. For example, the design software 14 may modify the circuit design 90 to group unused portions 94 of the programmable logic together. As such, the modified circuit design 90 may have greater power efficiency by allowing more logic components to be placed in the low-power mode. In some embodiments, the design software 14 may analyze and/or monitor the circuit design 90 to determine unused portions 94 of programmable logic. For example, the design software 14 may monitor the operation of the programmable logic device over a duration (e.g., hours, days, weeks, months, and so forth) and may determine predetermined periods of time when one or more portions of the programmable logic device are unused. As such, the design software 14 may determine the unused portions 94 correspond to one or more predetermined time periods. The design software 14 may perform partial reconfiguration of the programmable logic device to enable the low-power mode for the unused portions 94 during the predetermined time periods. For example, the design software 14 may perform partial reconfiguration to adjust a bit of the configuration memory 76 to enable the low-power mode. With the foregoing in mind, FIG. 14 illustrates a flowchart of a method 300 for reconfiguring programmable logic 48 based on unused portions 94 of the programmable logic 48 for the integrated circuit 12. For example, the method 300 may be associated with power gating unused portions 94 of the programmable logic 48. While the configuration memory 76 is described as performing the method 300, it should be noted that any suitable processor disposed in the integrated circuit 12 may perform the method 300. It should be understood that the method 300 may be performed in any suitable order and should not be limited to the order presented herein.

The design software 14 may receive (block 302) the circuit design 90 to implement in the integrated circuit 12. The circuit design 90 may detail the desired operations and functions of the integrated circuit 12. The compiler 16 may compile the circuit design 90 and provide to the integrated circuit 12.

Based on the circuit design, the design software 14 may analyze the corresponding programmed integrated circuit 12 to determine and identify unused portions 94 of programmable logic 48. In certain embodiments, the design software 14 may identify the unused portions 94 in one or more sectors 74 of the integrated circuit 12. Additionally or alternatively, the configuration memory 76 may determine and identify (block 304) unused portions 94 of programmable logic 48 based on the circuit design.

The configuration memory 76 may receive the circuit design 90 and program (e.g., configure) the programmable logic 48 based on the circuit design 90. Based on the identified unused portions 94, the configuration memory 76 may partially reconfigure (block 306) the programmable logic 48. For example, the partial reconfiguration may adjust a bit of the configuration memory 76 to implement the low-power mode.

Figure 15:
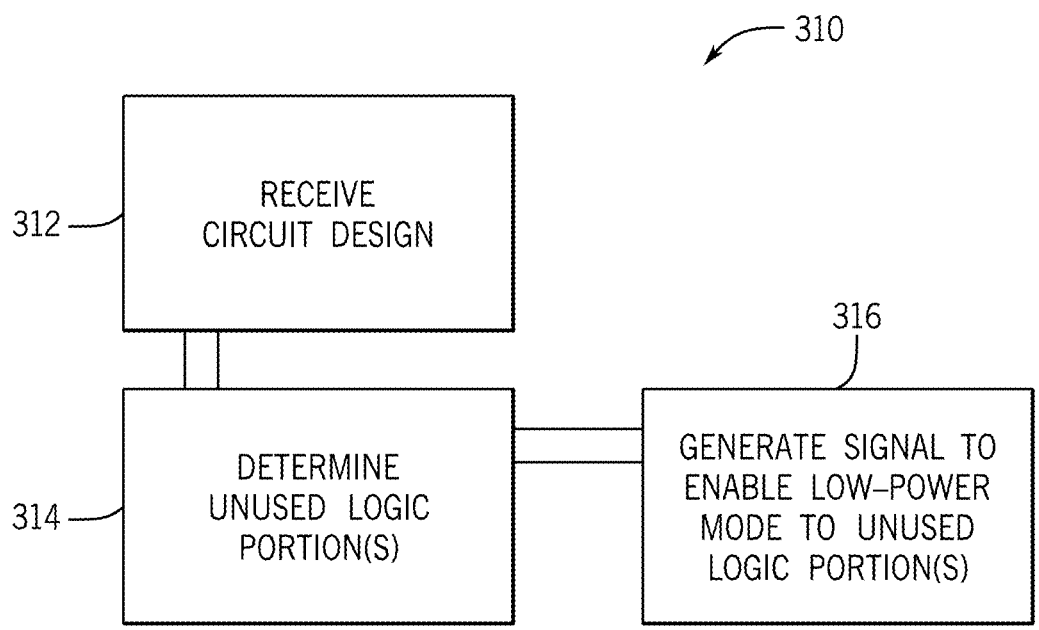
FIG. 15 is a process for generating signals to reduce power consumption of a programmable logic device based on unused portions of the programmable logic device, in accordance with an embodiment of the present disclosure.

With the foregoing in mind, FIG. 15 illustrates a flowchart of a method 310 for enabling the low-power mode in unused portions 94 of the programmable logic 48 for the integrated circuit 12. For example, the method 310 may be associated with power gating unused portions 94 of the programmable logic 48. While the host 18 is described as performing the method 310, it should be noted that any suitable processor disposed in the integrated circuit 12 may perform the method 310. It should be understood that the method 310 may be performed in any suitable order and should not be limited to the order presented herein.

The design software 14 may receive (block 312) the circuit design 90 to implement in the integrated circuit 12. The circuit design 90 may detail the desired operations and functions of the integrated circuit 12. The compiler 16 may compile the circuit design 90 and provide to the integrated circuit 12. The configuration memory 76 may receive the circuit design 90 and program (e.g., configure) the programmable logic 48 based on the circuit design 90

Based on the circuit design, the design software 14 may analyze the corresponding programmed integrated circuit 12 to determine (block 314) and identify unused portions 94 of programmable logic 48. In certain embodiments, the design software 14 may identify the unused portions 94 in one or more sectors 74 of the integrated circuit 12. Additionally or alternatively, the configuration memory 76 may determine and identify unused portions 94 of programmable logic 48 based on the circuit design.

Based on the identified unused portions 94, the host 18 may generate (block 316) a signal to enable the low-power mode in the unused portions 94. For example, the host 18 may generate a signal to switch the unused portions 94 to the low-power mode, as described herein. In some embodiments, the circuit design 90 may include additional control logic that may generate the signal to enable and/or disable the low-power mode.

Figure 16:
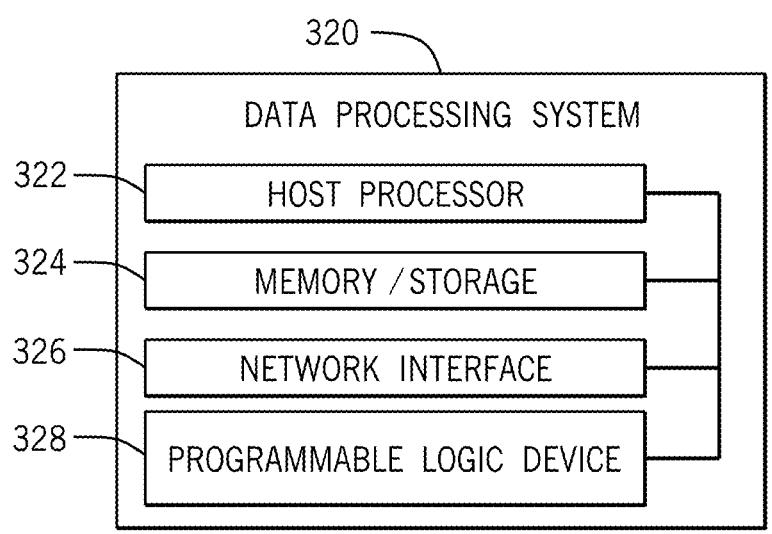
FIG. 16 is a block diagram of a data processing system where one or more logic blocks may be implemented, in accordance with an embodiment of the present disclosure.

The integrated circuit 12 may be a data processing system or a component included in a data processing system. For example, the integrated circuit 12 may be a component of a data processing system 320 shown in FIG. 16. The data processing system 320 may include a host processor 322 (e.g., a central-processing unit (CPU)), memory and/or storage circuitry 324, and a network interface 326. The data processing system 320 may include more or fewer components (e.g., electronic display, user interface structures, application specific integrated circuits (ASICs)). The host processor 322 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 320 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 324 may include random access memory (RAM), read-only memory (ROM), one or more hard drives, flash memory, or the like. The memory and/or storage circuitry 324 may hold data to be processed by the data processing system 320. In some cases, the memory and/or storage circuitry 324 may also store configuration programs (bitstreams) for programming the integrated circuit 12. The network interface 326 may allow the data processing system 320 to communicate with other electronic devices. The data processing system 320 may include several different packages or may be contained within a single package on a single package substrate.

In one example, the data processing system 320 may be part of a data center that processes a variety of different requests. For instance, the data processing system 320 may receive a data processing request via the network interface 326 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. A programmable logic device, comprising
 a plurality of programmable logic sectors that implement a circuit design;
 unused portions of the programmable logic device; and
 interconnection resources comprising:
  a multiplexer that receives a control signal and that generates an output signal based on the control signal; and
  a driver that receives the output signal and that implements a low-power mode to reduce leakage current.

EXAMPLE EMBODIMENT 2. The programmable logic device of example embodiment 1, wherein the unused portions comprise the interconnection resources.

EXAMPLE EMBODIMENT 3. The programmable logic device of example embodiment 1, wherein the driver comprises a metal-oxide-semiconductor (MOS) transistor.

EXAMPLE EMBODIMENT 4. The programmable logic device of example embodiment 3, wherein the leakage current occurs through the MOS transistor.

EXAMPLE EMBODIMENT 5. The programmable logic device of example embodiment 3, wherein a gate terminal of the MOS transistor receives the output signal.

EXAMPLE EMBODIMENT 6. The programmable logic device of example embodiment 3, wherein the MOS transistor comprises a P-channel MOS (PMOS) transistor and wherein the output signal comprises an overdriven voltage supply.

EXAMPLE EMBODIMENT 7. The programmable logic device of example embodiment 1, comprising configuration memory that controls implementation of the low-power mode.

EXAMPLE EMBODIMENT 8. The programmable logic device of example embodiment 7, wherein the configuration memory generates the control signal.

EXAMPLE EMBODIMENT 9. The programmable logic device of example embodiment 8, wherein the interconnection resources comprise a level shifter that provides output signals based on the control signal.

EXAMPLE EMBODIMENT 10. A field programmable gate array (FPGA), comprising:
 a plurality of programmable logic sectors of programmable logic that implement a circuit design;
 configuration memory that identifies unused portions of the programmable logic based on the circuit design and that generates a control signal based on the identified unused portions; and
 interconnection resources comprising:
  a multiplexer that receives the control signal and that generates an output signal based on the control signal; and
  a driver that implements a low-power mode based on the output signal.

EXAMPLE EMBODIMENT 11. The FPGA of example embodiment 10, wherein the multiplexer comprises a level shifter that provides a first voltage supply comprising a negative voltage supply, a second voltage supply comprising an overdriven voltage supply, or a combination thereof to a plurality of gate terminals of a plurality of metal-oxide-semiconductor (MOS) transistors.

EXAMPLE EMBODIMENT 12. The FPGA of example embodiment 11, wherein:
 the level shifter provides the first voltage supply to at least one P-channel MOS transistor; and the level shifter provides the second voltage supply to at least one N-channel MOS transistor.

EXAMPLE EMBODIMENT 13. The FPGA of example embodiment 11, wherein the driver comprises a P-channel metal-oxide-semiconductor (PMOS) transistor that receives the overdriven voltage supply in the low-power mode.

EXAMPLE EMBODIMENT 14. The FPGA of example embodiment 11, wherein the driver comprises an N-channel metal-oxide-semiconductor (NMOS) transistor that receives the negative voltage supply in the low-power mode.

EXAMPLE EMBODIMENT 15. The FPGA of example embodiment 14, wherein a gate terminal of the NMOS transistor receives the negative voltage supply to reduce leakage current through the NMOS transistor.

EXAMPLE EMBODIMENT 16. The FPGA of example embodiment 10, comprising a header transistor, wherein:
the unused portions comprise an arithmetic logic element;
the header transistor receives the control signal and implements the low-power mode for the arithmetic logic element.

EXAMPLE EMBODIMENT 17. The FPGA of example embodiment 10, comprising a footer transistor, wherein:
the unused portions comprise an arithmetic logic element;
the footer transistor receives the control signal and implements the low-power mode for the arithmetic logic element.

EXAMPLE EMBODIMENT 18. A method, comprising:
receiving a circuit design;
identifying one or more unused portions of programmable logic of a programmable logic device based on the circuit design; and
configuring the programmable logic device based on the circuit design, comprising:
programming a plurality of programmable logic sectors of the programmable logic to implement the circuit design; and
programming the one or more unused portions of the programmable logic to implement a low-power mode.

EXAMPLE EMBODIMENT 19. The method of example embodiment 18, programming the one or more unused portions comprising generating a control signal, via configuration memory of the programmable logic, to implement the low-power mode.

EXAMPLE EMBODIMENT 20. The method of example embodiment 18, wherein:
identifying the one or more unused portions of the programmable logic comprises determining one or more predetermined time periods associated with the one or more unused portions, wherein a respective predetermined time period of the one or more predetermined time periods corresponds to a respective unused portion of the one or more unused portions;
reconfiguring the programmable logic device based on the one or more predetermined time periods.

What is claimed is:

1. A programmable logic device, comprising:
a plurality of programmable logic sectors that implement a circuit design;
unused portions of the programmable logic device; and
interconnection resources comprising:
a multiplexer that receives a control signal and that generates an output signal based on the control signal, wherein the multiplexer comprises a level shifter that provides a negative voltage supply, an overdriven voltage supply, or both to a plurality of gate terminals of a plurality of metal-oxide-semiconductor (MOS) transistors; and
a driver that receives the output signal and that implements a low-power mode to reduce leakage current.

2. The programmable logic device of claim 1, wherein the unused portions comprise the interconnection resources.

3. The programmable logic device of claim 1, wherein the driver comprises a metal-oxide-semiconductor (MOS) transistor.

4. The programmable logic device of claim 3, wherein the leakage current occurs through the MOS transistor.

5. The programmable logic device of claim 3, wherein a gate terminal of the MOS transistor receives the output signal.

6. The programmable logic device of claim 3, wherein the MOS transistor comprises a P-channel MOS (PMOS) transistor and wherein the output signal comprises an overdriven voltage supply.

7. The programmable logic device of claim 1, comprising configuration memory that controls implementation of the low-power mode.

8. The programmable logic device of claim 7, wherein the configuration memory generates the control signal.

9. The programmable logic device of claim 8, wherein the level shifter provides output signals based on the control signal.

10. A field programmable gate array (FPGA), comprising:
a plurality of programmable logic sectors of programmable logic that implement a circuit design;
configuration memory that identifies unused portions of the programmable logic based on the circuit design and that generates a control signal based on the identified unused portions; and
interconnection resources comprising:
a multiplexer that receives the control signal and that provides an output signal based on the control signal, wherein the multiplexer comprises a level shifter that provides a negative voltage supply, an overdriven voltage supply, or both to a plurality of gate terminals of a plurality of metal-oxide-semiconductor (MOS) transistors; and
a driver that implements a low-power mode for the unused portions based on the output signal.

11. The FPGA of claim 10, wherein:
the level shifter provides the first voltage supply to at least one P-channel MOS transistor; and
the level shifter provides the second voltage supply to at least one N-channel MOS transistor.

12. The FPGA of claim 10, wherein the driver comprises a P-channel metal-oxide-semiconductor (PMOS) transistor that receives the overdriven voltage supply in the low-power mode.

13. The FPGA of claim 10, wherein the driver comprises an N-channel metal-oxide-semiconductor (NMOS) transistor that receives the negative voltage supply in the low-power mode.

14. The FPGA of claim 13, wherein a gate terminal of the NMOS transistor receives the negative voltage supply to reduce leakage current through the NMOS transistor.

15. The FPGA of claim 10, comprising a header transistor, wherein:
the unused portions comprise an arithmetic logic element;
the header transistor receives the control signal and implements the low-power mode for the arithmetic logic element.

16. The FPGA of claim 10, comprising a footer transistor, wherein:
the unused portions comprise an arithmetic logic element;
the footer transistor receives the control signal and implements the low-power mode for the arithmetic logic element.

17. A method, comprising:
receiving a circuit design;
identifying one or more unused portions of programmable logic of a programmable logic device based on the circuit design; and
configuring the programmable logic device based on the circuit design, comprising:
  programming a plurality of programmable logic sectors of the programmable logic to implement the circuit design;
  generating, via configuration memory of the programmable logic, a control signal;
  providing, via a multiplexer of interconnection resources, an output signal based on the control signal, wherein the multiplexer comprises a level shifter that provides a negative voltage supply, an overdriven voltage supply, or both to a plurality of gate terminals of a plurality of metal-oxide-semiconductor (MOS) transistors; and
  programming the one or more unused portions of the programmable logic to implement a low-power mode based on the control signal.

18. The method of claim 17, wherein identifying the one or more unused portions of the programmable logic comprises;
determining one or more predetermined time periods associated with the one or more unused portions, wherein a respective predetermined time period of the one or more predetermined time periods corresponds to a respective unused portion of the one or more unused portions; and
reconfiguring the programmable logic device based on the one or more predetermined time periods.

19. The method of claim 17, comprising:
generating an additional circuit design by grouping the one or more unused portions of the programmable logic; and
reconfiguring the programmable logic device based on the additional circuit design.

20. The method of claim 19, comprising:
performing a partial reconfiguration based on the additional circuit design by adjusting a bit of the configuration memory.

* * * * *